United States Patent [19]
Trosper

[11] Patent Number: 6,025,087
[45] Date of Patent: Feb. 15, 2000

[54] BATTERY MOUNTING AND TESTING APPARATUSES, METHODS OF FORMING BATTERY MOUNTING AND TESTING APPARATUSES, BATTERY-POWERED TEST CONFIGURED ELECTRONIC DEVICES, AND METHODS OF FORMING BATTERY-POWERED TEST CONFIGURED ELECTRONIC DEVICES

[75] Inventor: Scott T. Trosper, Meridian, Id.

[73] Assignee: Micron Technology, Inc., Boise, Id.

[21] Appl. No.: 09/026,247

[22] Filed: Feb. 19, 1998

[51] Int. Cl.$^7$ .......................... H01M 10/48; H01M 6/00
[52] U.S. Cl. ........................ 429/92; 429/90; 429/12.3; 429/93; 29/623.1; 29/623.5
[58] Field of Search ................. 429/7.1, 90, 94, 429/93, 124, 123; 29/623.1, 623.5

[56] References Cited

U.S. PATENT DOCUMENTS

| | | | |
|---|---|---|---|
| 5,558,679 | 9/1996 | Tuttle | 29/623.1 |
| 5,906,661 | 5/1999 | Lake | 29/623.5 |

OTHER PUBLICATIONS

U.S. application No. 09/026,250; Dando et al., filed Feb. 19, 1998.
U.S. application No. 09/026,249; Grigg et al., filed Feb. 19, 1998.

Primary Examiner—Maria Nuzzolillo
Assistant Examiner—Tracy Dove
Attorney, Agent, or Firm—Wells, st. John, Roberts, Gregory & Matkins, P.S.

[57] ABSTRACT

Battery mounting and testing apparatuses and methods of forming the same are described. In one implementation, a substrate includes a surface area over which a battery terminal housing member is to entirely cover. A conductive first test contact is disposed on the substrate surface and extends from within the surface area to outside of the surface area. A conductive second test contact is disposed on the substrate surface and extends from within the surface area to outside the surface area. The second test contact is spaced from the first test contact and is preferably electrically isolated therefrom on the substrate. In one aspect, an electronic device is provided by mounting a battery with the first and second test contacts. In circuit testing is performed after the battery is mounted utilizing the portions of the first and second test contacts which extend outside of the surface area for probe testing.

26 Claims, 5 Drawing Sheets

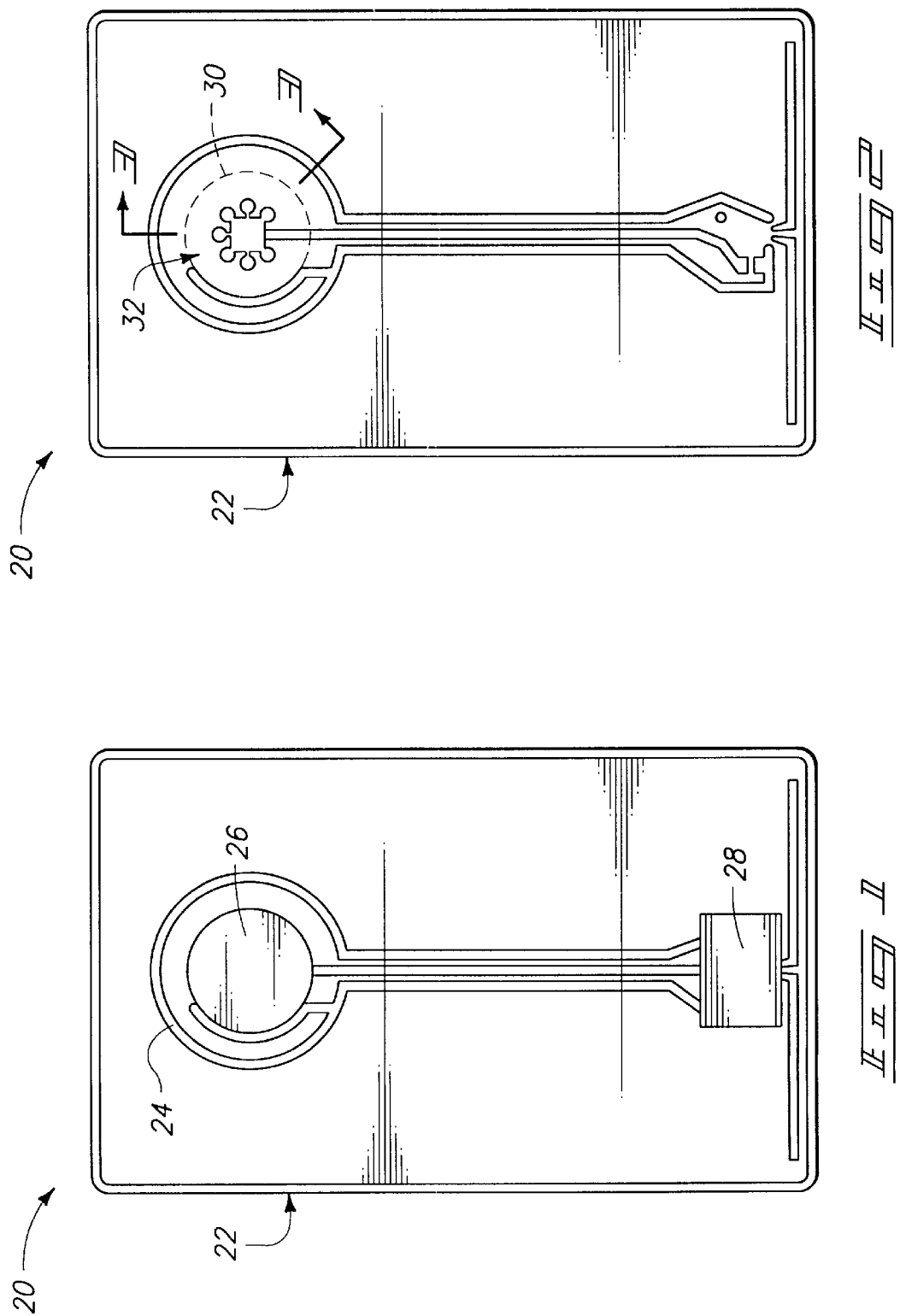

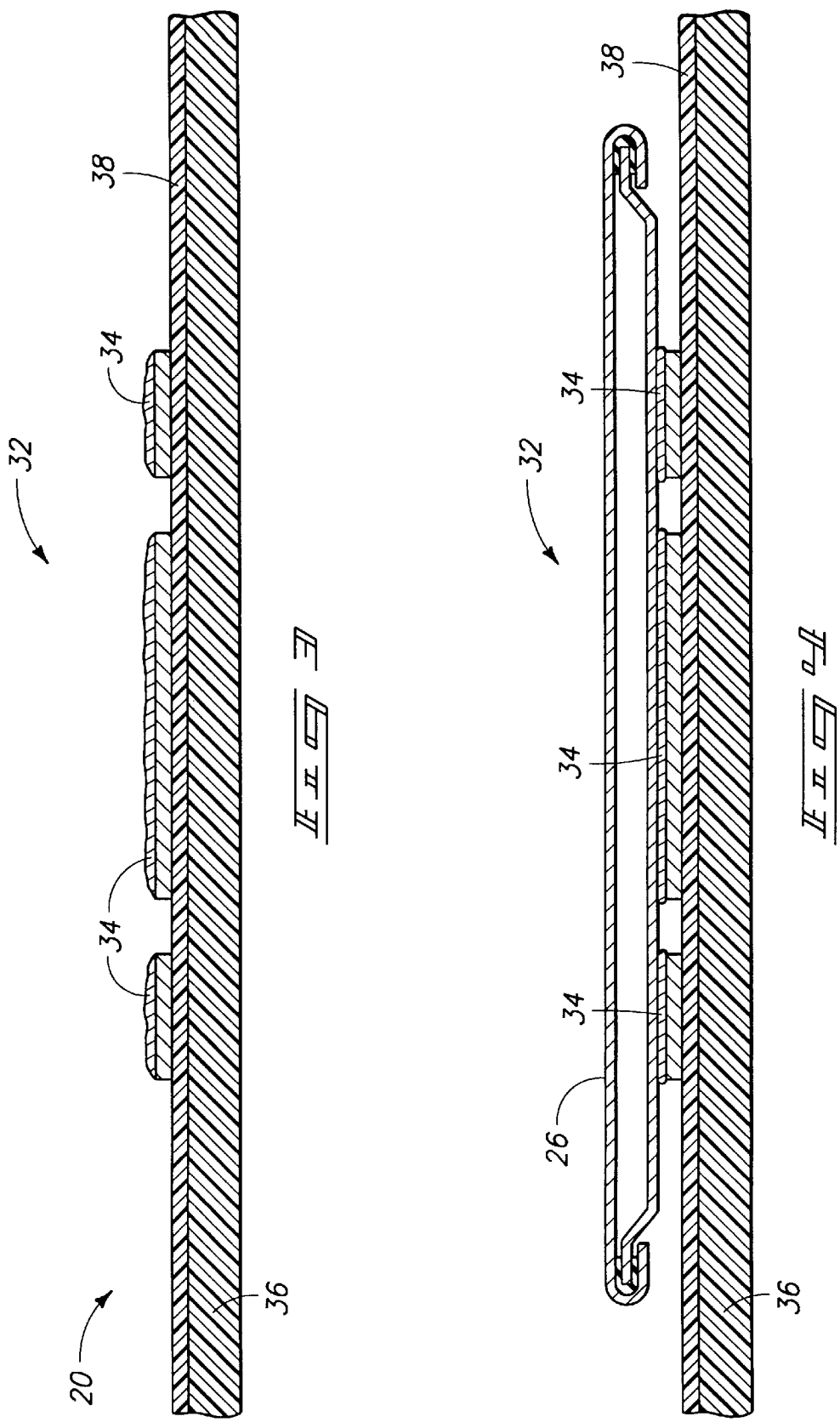

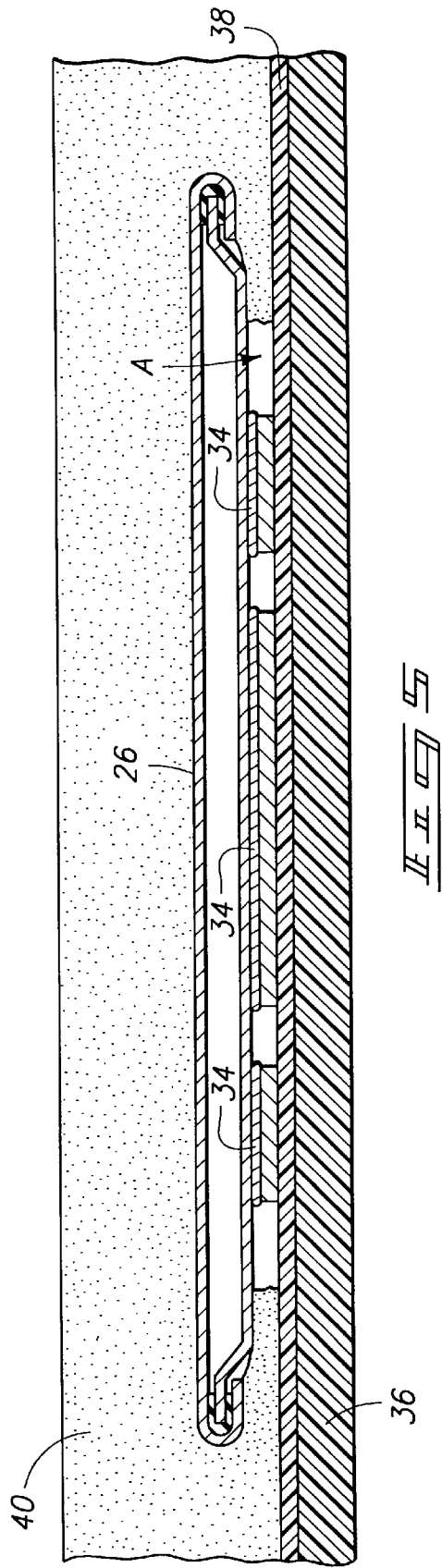

BATTERY MOUNTING AND TESTING
APPARATUSES, METHODS OF FORMING
BATTERY MOUNTING AND TESTING
APPARATUSES, BATTERY-POWERED TEST
CONFIGURED ELECTRONIC DEVICES,
AND METHODS OF FORMING BATTERY-
POWERED TEST CONFIGURED
ELECTRONIC DEVICES

TECHNICAL FIELD

This invention relates to battery mounting and testing apparatuses, methods of forming battery mounting and testing apparatuses, battery-powered test-configured electronic devices, and methods of forming battery-powered test-configured electronic devices.

BACKGROUND OF THE INVENTION

Electronic devices come in many shapes and sizes. One type of electronic device can be formed by mounting electronic device components on a substrate. Some substrates can be quite small, i.e. credit card-size or less, such that the resultant device formed thereon is itself quite small. There is generally, within the industry, an emphasis on decreasing overall device dimensions while increasing the overall performance and/or capabilities of a device. Such industry focus presents challenges regarding, among other things, providing a device package which is sufficient for its intended purpose, durable enough to withstand the abuses expected in the operating environment, and one which is configured to permit integrity testing at an intermediate point in the assembly of such devices.

An electronic device 20 is shown in FIGS. 1 and 2. Device 20 includes a flexible circuit substrate 22 upon which various electronic components have been mounted. In the illustrated example, device 20 is configured as a battery-powered communication device which is suitable for use as an RF communication device. Accordingly, device 20 includes an antenna 24 supported over substrate 22, a thin-profile battery 26 (FIG. 1) mounted on the substrate, and an integrated circuitry chip 28 configured for RF operation. An exemplary device and/or chip is shown and described in U.S. patent application Ser. No. 08/705,043, which names James O'Toole, John R. Tuttle, Mark E. Tuttle, Tyler Lowrey, Kevin Devereaux, George Pax, Brian Higgins, Shu-Sun Yu, David Ovard and Robert Rotzoll as inventors, which was filed on Aug. 29, 1996, is assigned to the assignee of this patent application, and which is incorporated by reference herein.

One challenge in producing a device such as device 20 relates to mounting the electronic components on the substrate; in particular, mounting battery 26 suitably on substrate 22 such that not only are desirable electrical connections made between electronic componentry and the battery, but the battery is sufficiently physically fixed over the substrate so that it does not become inadvertently dislodged. In addition, once electronic components are mounted on the substrate and before further processing, it is desirable to test or otherwise determine if the appropriate electrical connections have been made between the various components.

Referring to FIGS. 2 and 3, device 20 is shown prior to battery 26 being mounted thereon. Dashed line 30 in FIG. 2 depicts an outer perimeter of battery 26, were it to be mounted on the substrate. Shown generally at 32 and within perimeter 30 is a conductive contact s node pattern which, heretofore, has been utilized to form an electrical and mechanical connection with a thin-profile battery such as battery 26. The contact node pattern can be formed from a suitable conductive printed or screened-on ink such as silver printed thick film ink. Typically, such electrical and mechanical connection is formed through the application of a suitable conductive epoxy over the pattern, with the battery being subsequently bonded into place. When the battery is bonded into place, the contact node pattern is not directly accessible for verifying electrical connection with the battery.

Typically, a battery is bonded with the substrate as shown in FIGS. 3 and 4. One type of substrate which has been found suitable for use with electronic devices of the type described above includes a temporary carrier substrate 36 having a thin polyester substrate 38 bonded therewith. Conductive epoxy 34 is formed over each of the depicted node portions (not specifically designated). Battery 26 (FIG. 4) is placed into abutting contact with the epoxy (and node portions) such that a suitable bond is formed between a terminal housing member of the battery (not specifically designated) and the node portions over which the conductive epoxy was formed. The epoxy is subsequently cured into place, if necessary, and the substrate undergoes subsequent processing to provide a finished device.

It is desirable in some instances to encapsulate or otherwise fortify electronic devices for a number of different reasons. Encapsulant material, such as material 40 in FIG. 5, can increase the useful lifetime of the device by protecting the individual electronic components from outside influences. Encapsulant material can provide an added degree of support so that mounted components are not undesirably shifted or otherwise moved over the substrate once mounted thereon. It is also desirable, prior to encapsulating the devices, to test the devices for the integrity of the electrical connections made between the various electronic components thereon. Once the components, and in particular the battery, have been mounted on the substrate, however, it is difficult to suitably test or probe the electrical connection with the substrate because such connections are usually blocked by the components.

This invention arose out of concerns associated with providing improved apparatuses and methods for mounting and testing electronic components over substrates. This invention also arose out of concerns associated with providing improved electronic devices.

SUMMARY OF THE INVENTION

Battery mounting and testing apparatuses and methods of forming the same are described. In one embodiment, a substrate includes a surface area over which a battery terminal housing member is to entirely cover. A conductive first test contact is disposed on the substrate surface and extends from within the surface area to outside of the surface area. A conductive second test contact is disposed on the substrate surface and extends from within the surface area to outside the surface area. The second test contact is spaced from the first test contact and is preferably electrically isolated therefrom on the substrate. In one aspect, an electronic device is provided by mounting a battery on the first and second test contacts. In-circuit testing is performed after the battery is mounted utilizing the portions of the first and second test contacts which extend outside of the surface area for probe testing.

BRIEF DESCRIPTION OF THE DRAWINGS

Preferred embodiments of the invention are described below with reference to the following accompanying drawings.

FIG 1. is a view of an electronic device constructed in accordance with known methods.

FIG. 2 is a view of the FIG. 1 device with an electronic component removed for clarity.

FIG. 3 is a view which is taken along line 3—3 in FIG. 2.

FIG. 4 is a view similar to that of FIG. 3, except that it depicts the electronic device at a different processing step.

FIG. 5 is a view similar to that of FIG. 3, except that it depicts the electronic device at a different processing step.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 6:
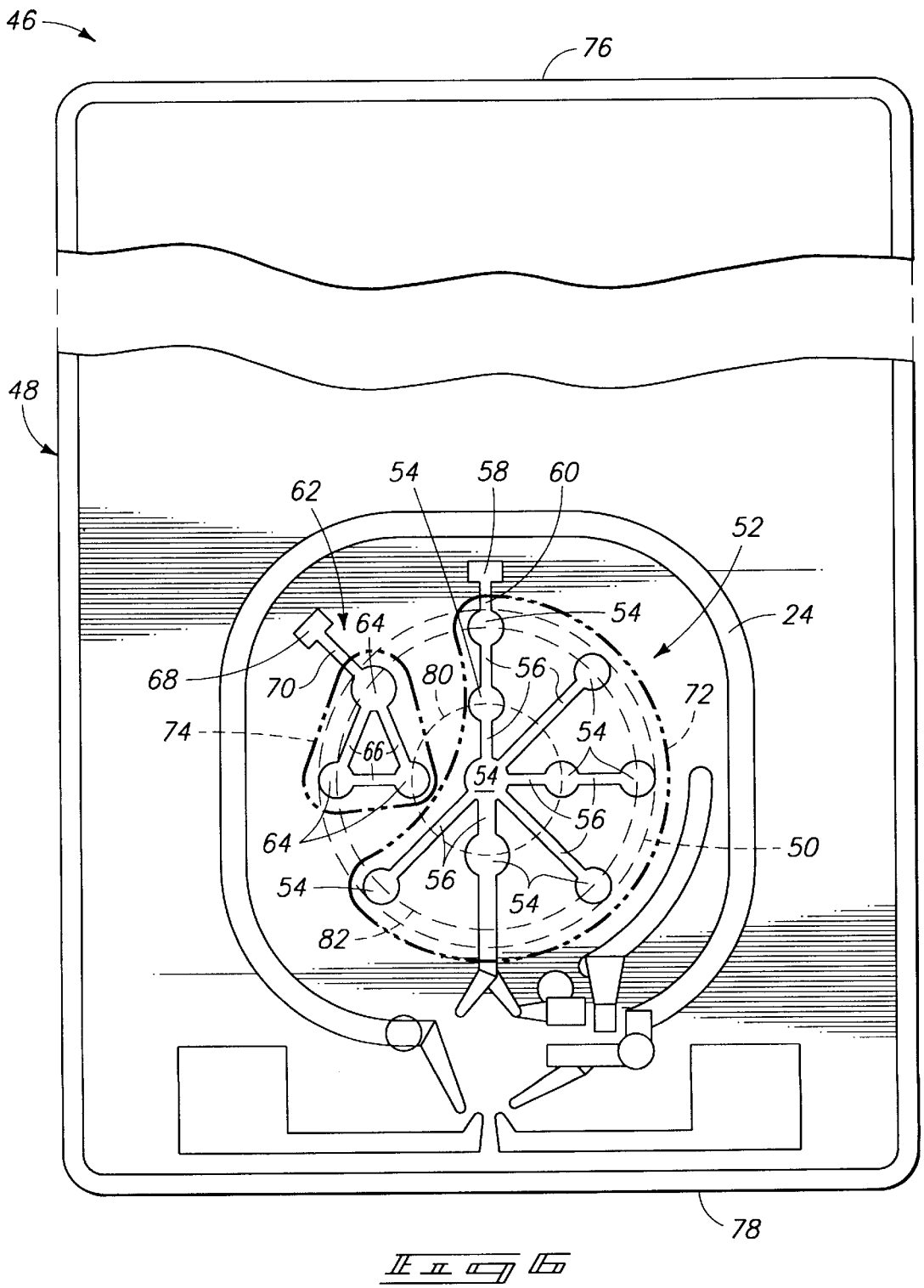
FIG. 6 is an enlarged view of a component-mounting apparatus constructed in accordance with one embodiment of the present invention.

Referring to FIG. 6, a battery mounting and testing apparatus is shown generally at 46. Apparatus 46 includes a substrate 48 having a surface area 50 (indicated by the dashed line) sized and shaped to be covered by a battery terminal housing member. In a preferred embodiment, the battery comprises a thin-profile battery and the terminal housing member is to entirely cover surface area 50. A conductive first test contact 52 is provided on substrate 48 and extends from within surface area 50 to outside of surface area 50. In the illustrated example, first test contact 52 comprises a plurality of individual nodes 54 which are in electrical communication with one another by virtue of conductive extensions 56. A first test contact extension 58 is provided and is in electrical communication with individual nodes 54 via a conductive extension 60.

A conductive second test contact 62 is provided on substrate 48 and extends from within surface area 50 to outside of surface area 50. In the illustrated example, second test contact 62 comprises a plurality of individual nodes 64 which are in electrical communication with one another within surface area 50 by virtue of conductive extensions 66 which extend therebetween. A second test contact extension 68 is provided outwardly of surface area 50 and is in electrical communication with nodes 64 via a conductive extension 70 which extends therebetween.

First and second test contacts 52, 62 are preferably spaced apart and electrically isolated from one another. In the illustrated example, first and second test contacts 52, 62 comprise a different number of individual nodes. Specifically, first test contact 52 comprises nine individual nodes 54 and second test contact 62 comprises three individual nodes 64. That portion of first test contact 52 which is within surface area 50 is different in shape from that portion of second test contact 62 which is within surface area 50. Both portions are sized to be conductively adhered with a terminal housing member of a thin-profile battery. In the illustrated example, that portion of first test contact 52 which is within surface area 50 approximates a crescent shape 72, and that portion of second test contact 62 which is within surface area 50 approximates a triangular shape 74. The portions of first and second test contacts 52, 62 which are outside of surface area 50, e.g. first and second test contact extensions 58, 68, are oriented about 45-degrees from one another about an arc. Specifically, in the illustrated example, surface area 50 is generally circular in shape and substrate 48 includes top and bottom sides 76, 78 respectively. When substrate 48 is viewed, as in FIG. 6, from top side-to-bottom side, first and second test contact extensions 58, 68 are disposed approximately at the 12:00 o'clock (0° position) and 10:30 o'clock (315° position) positions, respectively, relative to a central point, e.g. central node 54, within surface area 50.

Alternately considered, a first array of individual conductive nodes is provided over the substrate, with the nodes being disposed along a first continuous line 80. A second array of individual nodes is provided along a second continuous line 82 outwardly of first continuous line 80. At least one, and preferably both continuous lines 80, 82 approximate respective circles. One node of the first array (i.e., the right-most node 64) is electrically isolated from other nodes 54 of the first array, and is in electrical communication with some of the nodes of the second array (i.e., the two left-most nodes 64). Other different nodes of the first array (i.e., the remaining three nodes 54 disposed along line 80) are in electrical communication with one another, and with other different nodes of the second array disposed along line 82. Such other different nodes are not in electrical communication with the right-most node 64 of the first array.

Figure 7:
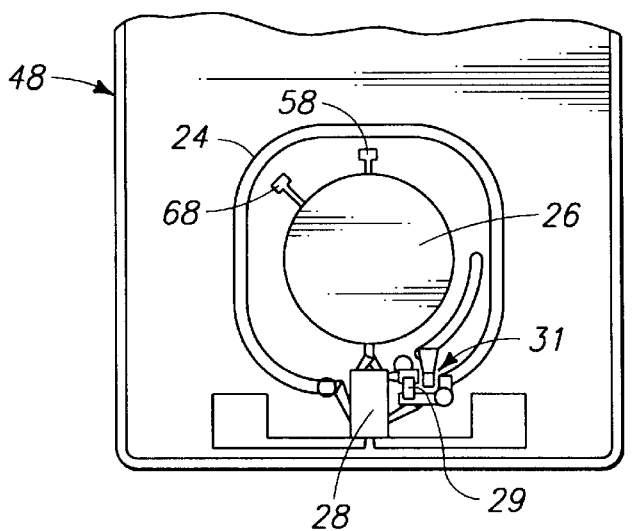
FIG. 7 is a view of a portion of an electronic device formed in accordance with one embodiment of the present invention.

Referring to FIGS. 6 and 7, a thin-profile battery 26 (FIG. 7) is conductively bonded or mounted on substrate 48, and with first and second test contacts 52, 62, via one of the battery's terminal housing members. Additionally, integrated circuit chip 28 and a capacitor 29 are bonded on the substrate as well. A gap 31 is provided and prevents a complete electrical circuit from being connected prior to probe testing which is described below. Gap 31 mitigates lock-up problems associated with chip 28. Such are described in more detail in commonly assigned U.S. patent application Ser. No. 08/954,551, which is incorporated by reference. The aforementioned bonding preferably takes place through the use of a conductive bonding epoxy.

First and second test contacts 52, 62 which were formerly electrically isolated from one another, are now placed into electrical communication, or electrically connected, with one another only through battery 26. First and second test contact extensions 58, 68 extend from respective locations between battery 26 and the substrate surface, to locations outward of the battery and are accessible for probe testing. In one aspect, battery 26 is bonded to, and spaced from the substrate surface with at least three discrete adhesive masses which allows encapsulant material to be formed under the battery. The discrete adhesive masses correspond to cured and/or otherwise solidified epoxy material disposed over individual nodes comprising first and second test contacts 52, 62. Accordingly, such masses are formed at different radial distances relative to a center of the battery.

Figure 8:
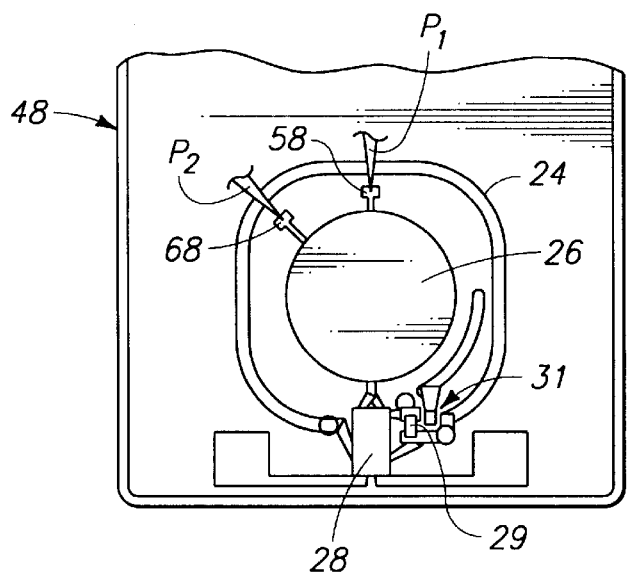
FIG. 8 is a view of the FIG. 7 device undergoing probe testing.

Referring to FIG. 8, after battery 26, chip 28, and capacitor 29 are mounted on substrate 48, the battery is probe tested with individual probes $P_1$, $P_2$. Probe testing enables the integrity of the electrical connection between first and second tests contacts 52, 62 and battery 26 to be determined by measuring the series resistance between the first and second test contacts. In particular, the series resistance between the conductive epoxy and the battery can be checked for values within a desirable range. Depending upon the nature of the components used, a particular resistance or range of resistances will indicate sufficient bonding between the battery and the contact pattern. Accordingly, resistance values outside of such resistance or range of resistances will indicate an insufficient bond. Other probe testing can take place at this time, including checking the antenna for proper conduction.

Figure 9:
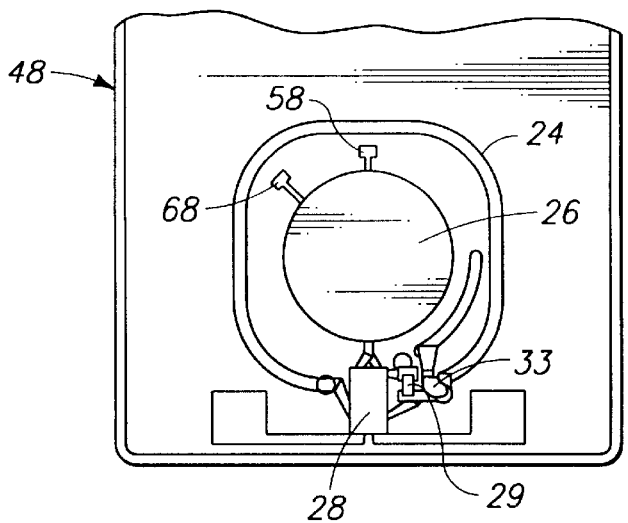
FIG. 9 is a view of the FIG. 7 device at a processing point after the FIG. 8 probe testing.

Referring to FIG. 9, and after battery 26 is probe tested, gap 31 is preferably bridged with conductive epoxy 33 to complete the electrical circuit as described in application Ser. No. 08/954,551 incorporated by reference above. Further processing can take place as described in copending, commonly-assigned application Ser. No. 09/026,250, entitled "Battery Mounting Apparatuses, Electronic Devices, And Methods Of Forming Electrical Connections", naming Ross S. Dando, Rickie C. Lake, and Krishna Kumar as inventors, concurrently filed with the application resulting in this patent, the disclosure of which is incorporated herein by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A battery mounting and testing apparatus comprising:
   a substrate having a surface area sized and shaped to be covered by a battery having first and second polarity terminal housing members, the surface area comprising a first area and a second area configured for electrical connection with one of the first and second polarity terminal housing members, the first and second areas being spaced and electrically isolated from one another on the substrate;
   a conductive first test contact on the substrate surface extending from within the surface area to outside of the surface area, the first test contact being in electrical connection with the first area and electrically isolated from the second area on the substrate; and
   a conductive second test contact on the substrate surface extending from within the surface area to outside the surface area, the second test contact being in electrical connection with the second area and spaced from the first test contact and being electrically isolated from the first area and the first test contact on the substrate.

2. The battery mounting and testing apparatus of claim 1, wherein at least one of the first and second test contacts comprise a plurality of individual nodes which are in electrical communication with one another within the surface area.

3. The battery mounting and testing apparatus of claim 1, wherein:
   the first test contact comprises a plurality of individual nodes within the surface area which are in electrical communication with one another; and
   the second test contact comprises a plurality of individual nodes within the surface area which are in electrical communication with one another.

4. If The battery mounting and testing apparatus of claim 3, wherein the pluralities of first and second test contact individual nodes each comprise a different number of individual nodes.

5. The battery mounting and testing apparatus of claim 1, wherein that portion of the first test contact which is within the surface area is different in shape from that portion of the second test contact which is within the surface area.

6. The battery mounting and testing apparatus of claim 5, wherein the first and second test contacts have portions extending outwardly of the surface area which are oriented about 45-degrees from one another about an arc.

7. The battery mounting and testing apparatus of claim 5, wherein the surface area is generally circular in shape and the substrate has top and bottom sides, and, when the substrate is viewed from top side-to-bottom side, one of the first and second test contact portions which extend outwardly of the surface area is disposed approximately at the 0° position, and the other of the first and second test contact portions is disposed approximately at the 315° position, relative to a central point within the surface area.

8. The battery mounting and testing apparatus of claim 5, wherein that portion of the first test contact within the surface area approximates a crescent shape.

9. The battery mounting and testing apparatus of claim 5, wherein that portion of the second test contact within the surface area approximates a triangular shape.

10. The battery mounting and testing apparatus of claim 5, wherein:
   the first test contact approximates a crescent shape within the surface area; and
   the second test contact approximates a triangular shape within the surface area.

11. A battery mounting and testing apparatus comprising:
   a substrate having a surface area sized and shaped to be covered by a battery having first and second polarity terminal housing members, the surface area comprising a first area and a second area configured for electrical connection with one of the first and second polarity terminal housing members, the first and second areas being spaced and electrically isolated from one another on the substrate;
   a conductive first test contact on the substrate, the first test contact being in electrical connection with the first area and electrically isolated from the second area on the substrate, the conductive first test contact having a portion which is within the surface area for conductively adhering with the one terminal housing member of the battery, and another portion which extends from within the surface area to outside of the surface area; and
   a conductive second test contact on the substrate having a portion which is within the surface area for conductively adhering with the terminal housing member of the battery and in electrical connection with the second area, and another portion which extends from within the surface area to outside of the surface area, the second test contact being spaced from the first test contact and electrically isolated from the first area and the first test contact on the substrate.

12. The battery mounting and testing apparatus of claim 11, wherein one of the first and second test contacts comprise a plurality of individual nodes which are in electrical communication with one another.

13. The battery mounting and testing apparatus of claim 11, wherein both of the first and second test contacts comprise a plurality of individual nodes which are respectively in electrical communication with one another within the surface area.

14. The battery mounting and testing apparatus of claim 13, wherein the first and second test contacts comprise different numbers of individual nodes.

15. A battery mounting and testing apparatus comprising:

a substrate having a surface area sized and shaped to be covered by a battery terminal housing member;

a first array comprising individual conductive nodes over the substrate and within the surface area for conductively adhering with the terminal housing member, the individual nodes being disposed along a first continuous line; and a second array comprising individual conductive nodes over the substrate and within the surface area for conductively adhering with the terminal housing member, the individual nodes of the second array being disposed along a second continuous line outwardly of the first continuous line, one node of the first array being electrically isolated from other nodes of the first array and in electrical communication with some nodes of the second array and collectively comprising therewith a test contact having a conductive extension which extends from within the surface area to outside of the surface area, other different nodes of the first array being in electrical communication with one another and with other different nodes of the second array which are not in electrical communication with said one node of the first array and collectively comprising therewith a different test contact having a different conductive extension which extends from within the surface area to outside of the surface area.

16. The battery mounting and testing apparatus of claim 15, wherein one of the first and second continuous lines approximates a circle.

17. The battery mounting and testing apparatus of claim 15, wherein both of the first and second continuous lines approximate a circle.

18. The battery mounting and testing apparatus of claim 15, wherein those respective portions of the test contacts which are disposed within the surface area are shaped differently from one another.

19. A battery mounting and testing apparatus forming method comprising:

providing a substrate having a surface area sized and shaped to be covered with a battery having first and second polarity terminal housing members, the surface area comprising a first area and a second area configured for electrical connection with one of the first and second polarity terminal housing members, the first and second areas being spaced and electrically isolated from one another on the substrate;

forming a conductive first test contact on the substrate surface extending from within the surface area to outside of the surface areas the first test contact being in electrical connection with the first area and electrically isolated from the second area on the substrate; and forming a conductive second test contact on the substrate surface extending from within the surface area to outside the surface area, the second test contact being in electrical connection with the second area and spaced from the first test contact and being electrically isolated from the first area and the first test contact on the substrate.

20. The battery mounting and testing apparatus forming method of claim 19, wherein the forming of the first and second test contacts comprises forming those portions of the first and second test contacts which are within the surface area to have different shapes.

21. A battery mounting and testing apparatus comprising:

a substrate having a surface area sized and shaped to be covered by a battery terminal housing member;

a conductive first test contact on the substrate surface extending from within the surface area to outside of the surface area;

a conductive second test contact on the substrate surface extending from within the surface area to outside the surface area, the second test contact being spaced from the first test contact and being electrically isolated therefrom on the substrate; and wherein at least one of the first and second test contacts comprise a plurality of individual nodes which are in electrical communication with one another within the surface area.

22. The battery mounting and testing apparatus of claim 21 wherein:

the first test contact comprises a plurality of individual nodes within the surface area which are in electrical communication with one another; and the second test contact comprises a plurality of individual nodes within the surface area which are in electrical communication with one another.

23. The battery mounting and testing apparatus of claim 22, wherein the pluralities of first and second test contact individual nodes each comprise a different number of individual nodes.

24. A battery mounting and testing apparatus comprising:

a substrate having a surface area sized and shaped to be covered by a battery terminal housing member;

a conductive first test contact on the substrate having a portion which is within the surface area for conductively adhering with the terminal housing member of the battery, and another portion which extends from within the surface area to outside of the surface area;

a conductive second test contact on the substrate having a portion which is within the surface area for conductively adhering with the terminal housing member of the battery, and another portion which extends from within the surface area to outside of the surface area, the second test contact being spaced from the first test contact and electrically isolated therefrom on the substrate; and wherein one of the first and second test contacts comprise a plurality of individual nodes which are in electrical communication with one another.

25. The battery mounting and testing apparatus of claim 24, wherein both of the first and second test contacts comprise a plurality of individual nodes which are respectively in electrical communication with one another within the surface area.

26. The battery mounting and testing apparatus of claim 25, wherein the first and second test contacts comprise different numbers of individual nodes.

* * * * *